US008010062B2

(12) United States Patent
Rofougaran

(10) Patent No.: US 8,010,062 B2
(45) Date of Patent: Aug. 30, 2011

(54) MULTIPLE FREQUENCY ANTENNA ARRAY FOR USE WITH AN RF TRANSMITTER OR RECEIVER

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/613,759

(22) Filed: Nov. 6, 2009

(65) Prior Publication Data

US 2010/0053009 A1 Mar. 4, 2010

Related U.S. Application Data

(62) Division of application No. 11/529,058, filed on Sep. 28, 2006, now Pat. No. 7,792,548.

(51) Int. Cl.
*H03C 7/02* (2006.01)

(52) U.S. Cl. ........ 455/101; 455/103; 455/273; 455/504; 455/456.1; 455/33; 343/700; 343/795; 343/702; 343/882; 342/359; 342/361; 342/367; 342/357.02; 342/457

(58) Field of Classification Search .................. 455/273, 455/504, 456.1, 33, 59, 101, 103; 343/700, 343/795, 702, 882; 342/359, 361, 367, 357.02, 342/450, 457
See application file for complete search history.

(56) References Cited

U.S. PATENT DOCUMENTS 4,253,193 A 2/1981 Kennard et al.
4,747,160 A * 5/1988 Bossard .................... 455/422.1
5,570,412 A * 10/1996 LeBlanc .................... 455/456.2
5,649,287 A * 7/1997 Forssen et al. ................ 370/312
5,717,406 A * 2/1998 Sanderford et al. .......... 342/457
6,088,570 A 7/2000 Komara et al.
6,161,004 A 12/2000 Galal et al.
6,271,790 B2 8/2001 Smith
6,960,962 B2 11/2005 Peterzell et al.
7,532,896 B2 * 5/2009 Friday et al. ............... 455/456.1
2002/0042256 A1 4/2002 Baldwin et al.
2002/0149524 A1 10/2002 Boyle
(Continued)

FOREIGN PATENT DOCUMENTS

JP 10028013 1/1998
(Continued)

OTHER PUBLICATIONS

Yaghjian, A. D. and Best, S. R., “Impedance, Bandwidth, and Q of Antennas”, Apr. 2005, IEEE Transactions on Antennas and Propagation, vol. 53, No. 4, Apr. 2005.*

(Continued)

*Primary Examiner* — Edward Urban
*Assistant Examiner* — Ganiyu Hanidu
(74) *Attorney, Agent, or Firm* — Garlick Harrison & Markison

(57) ABSTRACT

A multiple frequency antenna array includes a first antenna circuit and a second antenna circuit. The first antenna circuit has a first radiation pattern and is tuned to a first carrier frequency. The first antenna circuit transmits a first representation of a radio frequency (RF) signal at the first carrier frequency, where the first carrier frequency corresponds to a carrier frequency of the RF signal and a first frequency offset. The second antenna circuit has a second radiation pattern and is tuned to a second carrier frequency. The second antenna circuit transmits a second representation of the RF signal at the second carrier frequency, where the second carrier frequency corresponds to the carrier frequency of the RF signal and a second frequency offset.

14 Claims, 12 Drawing Sheets

U.S. PATENT DOCUMENTS

| | | | | |
|---|---|---|---|---|
| 2004/0038649 | A1 | 2/2004 | Lin et al. | |
| 2004/0127174 | A1 * | 7/2004 | Frank et al. | 455/101 |
| 2005/0116864 | A1 * | 6/2005 | Mohamadi | 343/700 MS |
| 2005/0259011 | A1 | 11/2005 | Vance | |
| 2007/0072561 | A1 | 3/2007 | Weber et al. | |
| 2010/0172309 | A1 * | 7/2010 | Forenza et al. | 370/329 |

FOREIGN PATENT DOCUMENTS

| | | | |
|---|---|---|---|
| WO | 9903166 | | 1/1999 |
| WO | 9903166 | A1 | 1/1999 |

OTHER PUBLICATIONS

Bensson, Oliver and Stoica, Petre, "On Parameter Estimation of MIMO Flat-Fading Channels with Frequency Offsets", Mar. 2003, IEEE Transactions on Signal Processing, vol. 51, No. 3, Mar. 2003.*

Mattheijssen, Paul et al., "Antenna-Pattern Diversity Versus Space Diversity for Use at Handhelds", Jul. 2004, IEEE Transactions on Vehicular Technology, vol. 53, No. 4, Jul. 2004.*

* cited by examiner

MULTIPLE FREQUENCY ANTENNA ARRAY FOR USE WITH AN RF TRANSMITTER OR RECEIVER

CROSS REFERENCE TO RELATED PATENTS

The present U.S. Utility Patent Application claims priority pursuant to 35 U.S.C. §120, as a divisional, to the U.S. Utility application Ser. No. 11/529,058, entitled "Multiple Frequency Antenna Array for Use with an RF Transmitter or Transceiver," filed Sep. 28, 2006, pending, which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to wireless communication systems and more particularly to antenna structures used by radio frequency (RF) transceivers within such wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Since the wireless part of a wireless communication begins and ends with the antenna, a properly designed antenna structure is an important component of wireless communication devices. As is known, the antenna structure is designed to have a desired impedance (e.g., 50 Ohms) at an operating frequency, a desired bandwidth centered at the desired operating frequency, and a desired length (e.g., ¼ wavelength of the operating frequency for a monopole antenna). As is further known, the antenna structure may include one or more monopole antennas and/or dipole antennas having a diversity antenna structure, the same polarization, different polarization, and/or any number of other electro-magnetic properties.

When the antenna structure includes more than one antenna, the radiation patterns of the antennas overlap at least to some degree. In the overlap areas, nulls may occur where the RF signal transmitted by one antenna is about 180° out of phase with the same RF signal being transmitted by another antenna, thereby substantially reduce the signal strength of the RF signal. If the targeted receiver is located within a null, its ability to accurately recover data from the RF signal is impaired.

Therefore, a need exists for an antenna structure that reduces the occurrences of nulls.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

DETAILED DESCRIPTION OF THE INVENTION

Figure 1:
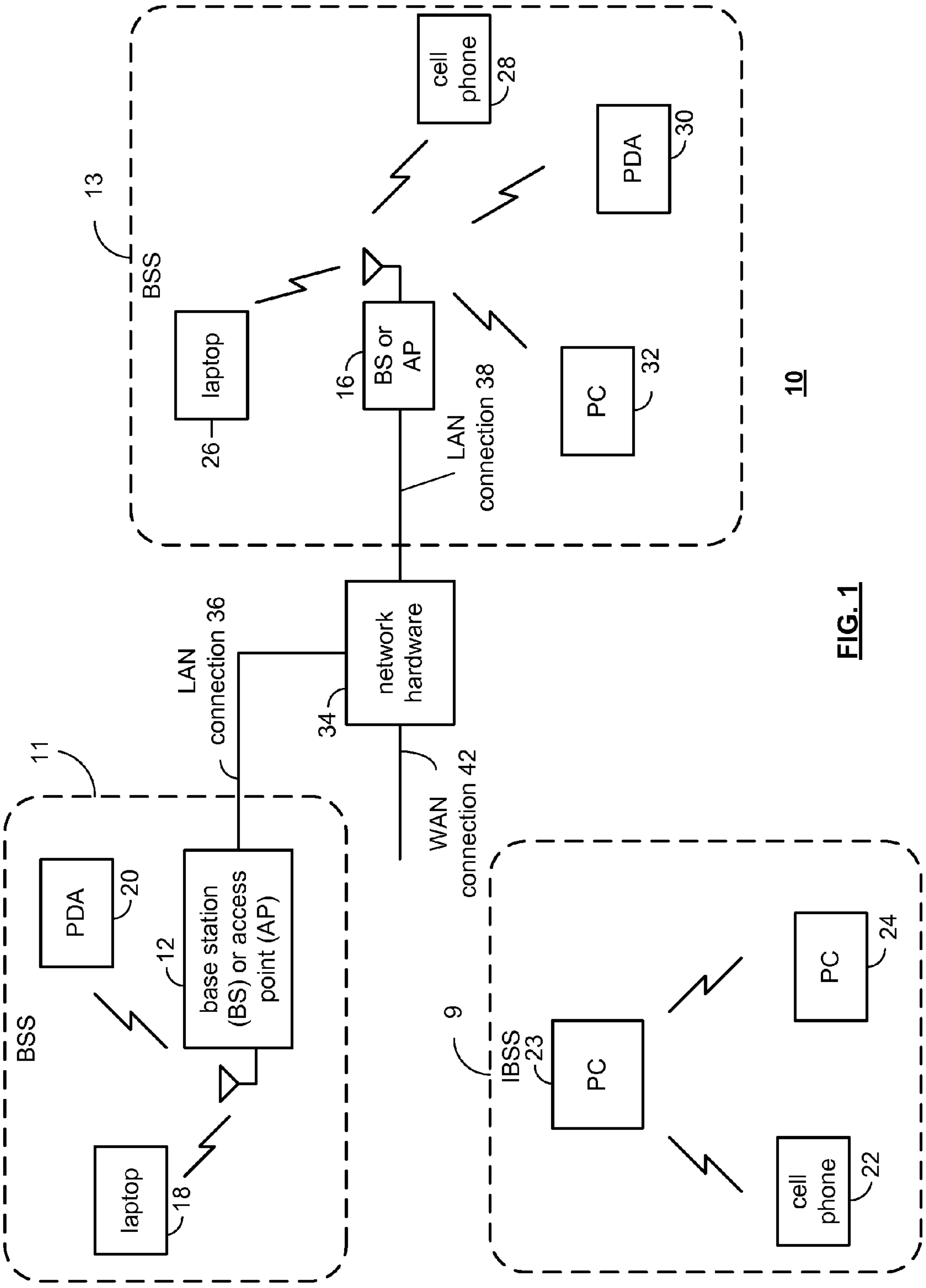
FIG. 1 is a schematic block diagram of a wireless communication system in accordance with the present invention.

FIG. 1 illustrates a schematic block diagram of a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
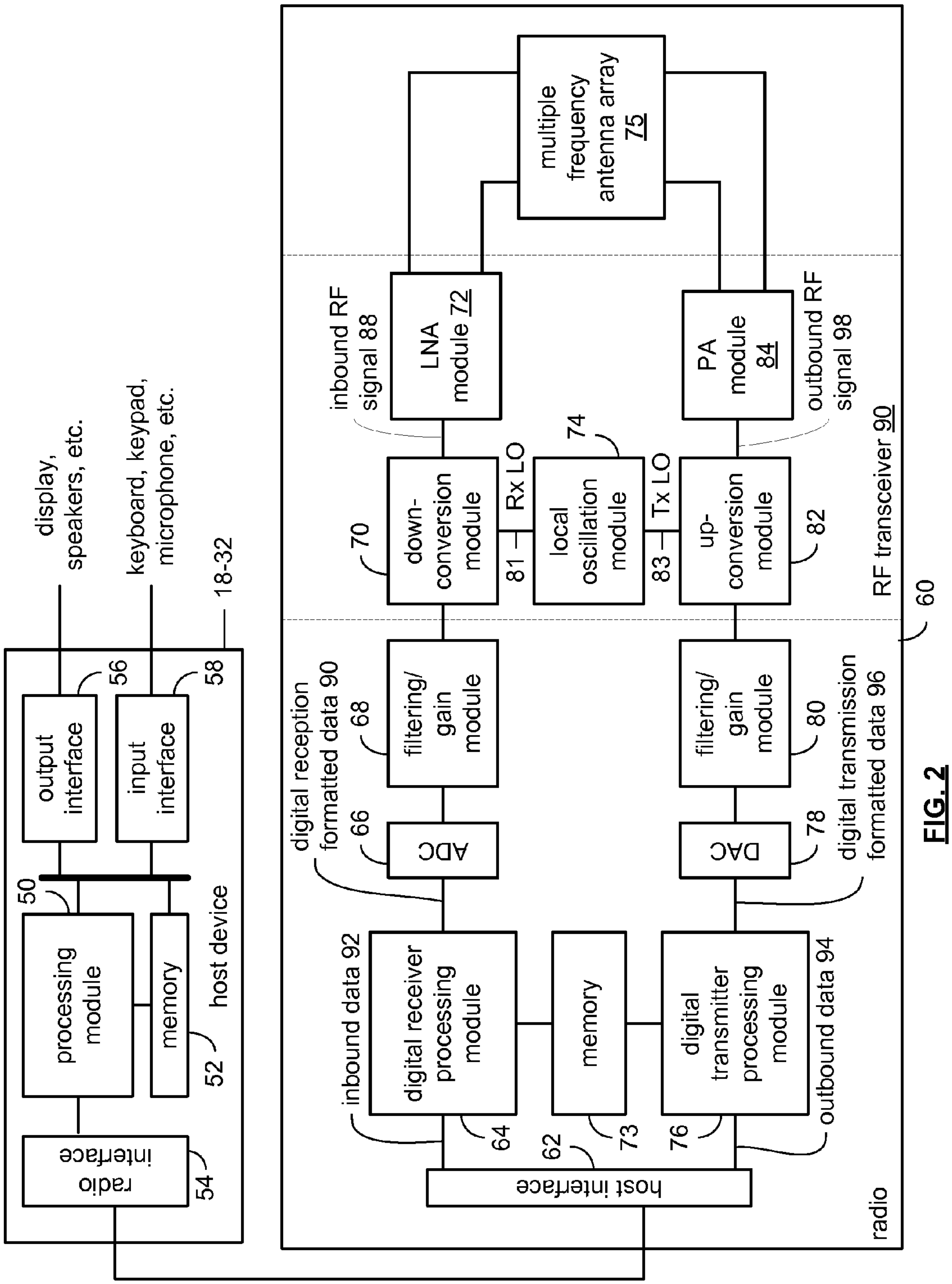
FIG. 2 is a schematic block diagram of a wireless communication device in accordance with the present invention.

FIG. 2 illustrates a schematic block diagram of a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component. As one of ordinary skill in the art will appreciate, the radio 60 may be a stand alone device (i.e., not associated with a host) and/or may be used in a multitude of other applications for transceiving RF signals.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, analog-to-digital converter 66, filtering/gain module 68, down conversion module 70, low noise amplifier module 72, local oscillation module 74, memory 73, digital transmitter processing module 76, digital-to-analog converter 78, filtering/gain module 80, up-conversion module 82, power amplifier module 84, and an multiple frequency antenna array 75, which will be described in greater detail with reference to one or more of FIGS. 3-9. Note that the down conversion module 70, the low noise amplifier module 72, the local oscillation module 74, the up conversion module 82, and power amplifier module 84 may collectively be referred to as an RF transceiver 90.

The digital receiver processing module 64 and the digital transmitter processing module 76, in combination with operational instructions stored in memory 73 and/or internally stored, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 73 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter module 78, which may include one or more digital to analog converters, converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation 83 provided by local oscillation module 74. The power amplifier module 84, which will be described in greater detail with reference to FIGS. 10-13, amplifies the RF signal to produce an outbound RF signal 98. The multiple frequency antenna array 75 transmits the outbound RF signal 98 to a targeted device such as a base station, an access point and/or another wireless communication device.

The radio 60 also receives an inbound RF signal 88 via the multiple frequency antenna array 75, where the inbound RF signal 88 was transmitted by a base station, an access point, or another wireless communication device. The multiple frequency antenna array 75 provides the inbound RF signal 88 to the low noise amplifier module 72, which may include one or more low noise amplifiers to amplify the inbound RF signal 88 to produce an amplified inbound RF signal. The low noise amplifier module 72 provide the amplified inbound RF signal to the down conversion module 70, which directly converts the amplified inbound RF signal into an inbound low IF signal based on a receiver local oscillation 81 provided by local oscillation module 74. The down conversion module 70 provides the inbound low IF signal to the filtering/gain module 68, which filters and/or adjusts the gain of the signal before providing it to the analog to digital converter module 66.

The analog-to-digital converter module 66, which includes one or more digital to analog converters, converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of ordinary skill in the art will appreciate, the radio 60 may be implemented via one or more integrated circuits. For example, the entire radio 60 may be implemented on one IC, including the multiple frequency antenna array 75. As another example, the radio 60 may be implemented on one IC less the multiple frequency antenna array 75, which may be implemented on another IC, on a printed circuit board, and/or as a free standing structure. As yet another example, the RF transceiver 90 may be implemented on one IC and the remaining modules of the radio 60 less the multiple frequency antenna array 75 may be implemented on another IC. As a further example, the digital receiver and transmitter processing modules 64 and 76 may be on one IC, while the remaining modules of the radio 60, less the multiple frequency antenna array 75, are on another IC.

Figure 3:
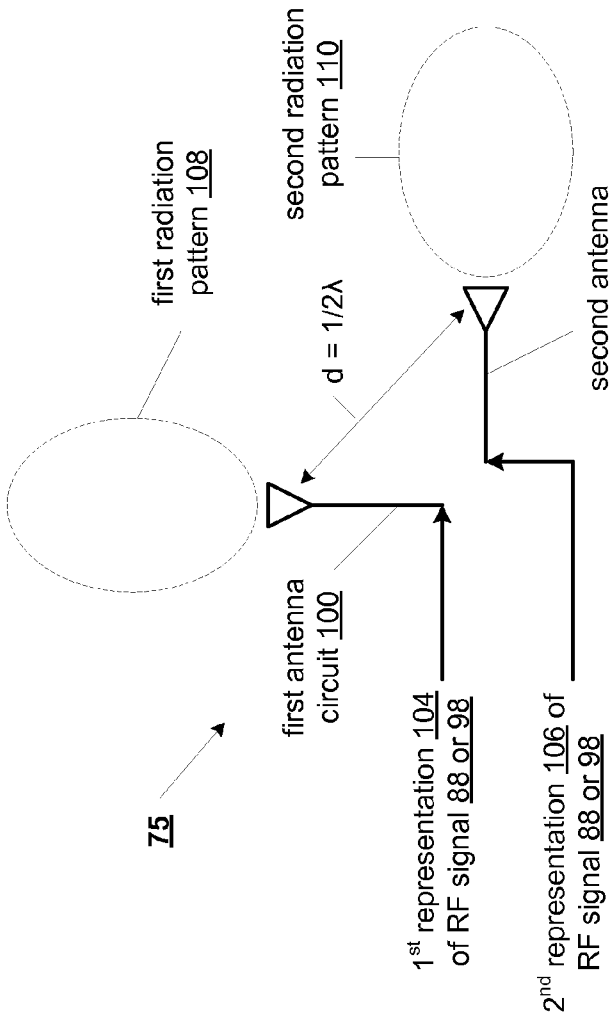
FIG. 3 is a diagram of an embodiment of a multiple frequency antenna array in accordance with the present invention.

FIG. 3 is a diagram of an embodiment of a multiple frequency antenna array 75 that includes a first antenna circuit 100 and a second antenna circuit 102. The first antenna circuit 100 has a first radiation pattern 108, which is based on the type of antenna and the polarization antenna. In this example, the antenna may be a monopole antenna, a dipole antenna, a Yagi antenna, or a helical antenna as disclosed in co-pending patent applications entitled PLANER HELICAL ANTENNA, having a Ser. No. of 11/386,247, and a filing data of Mar. 21, 2006and entitled A PLANER ANTENNA STRUCTURE, having a Ser. No. of 11/451,752, and a filing date of Jun. 12, 2006.

The first antenna circuit 100 is tuned to a first carrier frequency that is based on the carrier frequency of the RF signal (e.g., inbound RF signal 88 and/or outbound RF signal 98) and a first frequency offset 112. The first frequency offset 112 is of a value to change the frequency of the RF signal by a relatively small amount thereby keeping it within the bandwidth of the RF transceiver 90. For example and with reference to FIG. 4, the RF signal 88 or 98 may be in the 900 MHz frequency band and have a carrier frequency of 880 MHz for the inbound RF signals 96 and/or 920 MHz for the outbound RF signals 98. The frequency offset may be up to a few percent of the carrier frequency (e.g., up to 27 MHz) such that a representation 104 of the RF signal 88 or 98 is at the first carrier frequency (i.e., the carrier frequency of the RF signal 88 or 98 plus or minus the first frequency offset (Δf1) 112).

The second antenna circuit 102, which may be ½ wavelength (λ) from the first antenna circuit 100 has a second radiation pattern 110, which is based on the type of antenna and the polarization antenna. In this example, the antenna may be a monopole antenna, a dipole antenna, a Yagi antenna, or a helical antenna as disclosed in co-pending patent applications entitled PLANER HELICAL ANTENNA, having a Ser. No. 11/386,247, and a filing data of Mar. 21, 2006 and entitled A PLANER ANTENNA STRUCTURE, having a Ser. No. 11/451,752, and a filing date of Jun. 12, 2006.

The second antenna circuit 102 is tuned to a second carrier frequency that is based on the carrier frequency of the RF signal (e.g., inbound RF signal 88 and/or outbound RF signal 98) and a second frequency offset 114. The second frequency offset 114 is of a value to change the frequency of the RF signal by a relatively small amount thereby keeping it within the bandwidth of the RF transceiver 90. For example and with reference to FIG. 4, the RF signal 88 or 98 may be in the 900 MHz frequency band and have a carrier frequency of 880 MHz for the inbound RF signals 96 and/or 920 MHz for the outbound RF signals 98. The second frequency offset 114 may be up to a few percent of the carrier frequency (e.g., up to 27 MHz), but different than the first frequency offset 112 such that a representation 106 of the RF signal 88 or 98 is at the second carrier frequency (i.e., the carrier frequency of the RF signal 88 or 98 plus or minus the second frequency offset (Δf2) 114).

Figure 4:
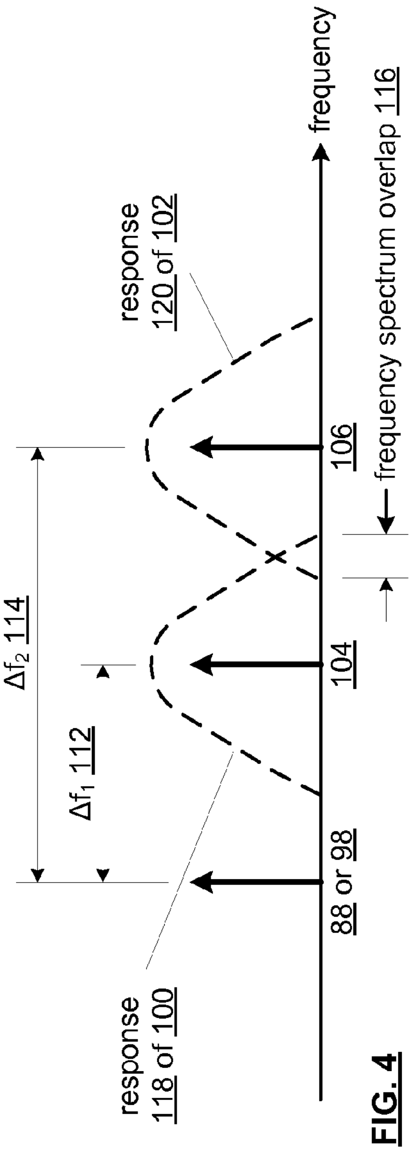
FIG. 4 is a frequency domain diagram of responses of the multiple frequency antenna array embodiment of FIG. 3.

With reference to FIGS. 3 and 4, the response 118 of the first antenna circuit 100 and the response 120 of the second antenna circuit 102 are dependent upon the characteristics of the antenna circuits 100 and 102. In addition, an acceptable level of frequency spectrum overlap 116 factors into the design of the antenna circuits. For instance, the quality factor of an antenna circuit affects the selectivity (i.e., bandwidth and roll off) of the antenna response 118 and 120. The quality factor (Q) of the antenna circuits 100 and 102 is determined by its inductive, resistive, and capacitive properties. For example, in a series resonant circuit $\omega_0 L=1/\omega_0 C$, thus $Q=\omega_0 L/R$ or $Q=1/\omega_0 CR$, for a parallel resonant circuit $\omega_0=\sqrt{(1/LC)}*\sqrt{(1-1/Q^2)}$, and the half power point corresponds to dv=v0*Q/2, where v0 is the resonant frequency and dv is the half power frequency offset from v0. As such, the antenna circuits 100 and 102 may be tuned to the desired frequency and selectivity to achieve a frequency spectrum as shown in FIG. 4.

Figure 5:
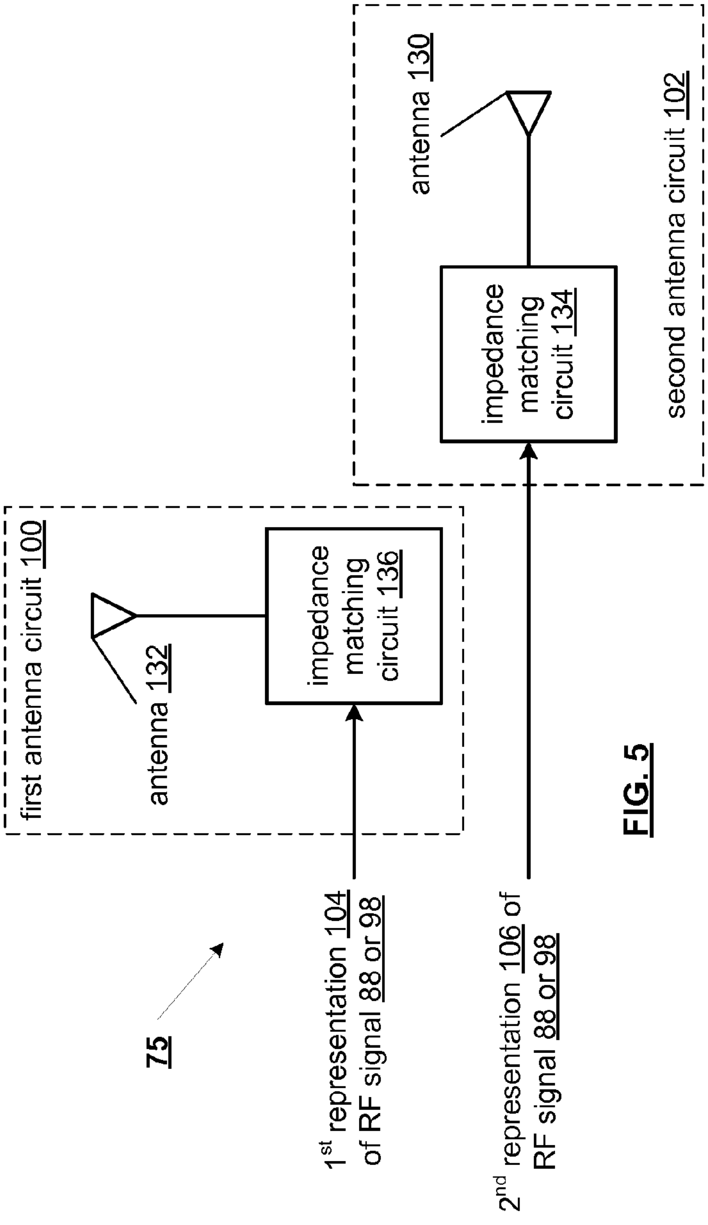
FIG. 5 is a schematic block diagram of another embodiment of a multiple frequency antenna array in accordance with the present invention.

FIG. 5 is a schematic block diagram of another embodiment of a multiple frequency antenna array 75 that includes the first antenna circuit 100 and the second antenna circuit 102. In this embodiment, the first and second antenna circuits 100 and 102 each include an antenna 132 and 130 and an impedance matching circuit 136 and 134, respectively. The antennas 130 and 132 may be monopole antennas, dipole antennas, Yagi antennas, and/or helical antenna as disclosed in co-pending patent applications entitled PLANER HELICAL ANTENNA, having a Ser. No. 11/386,247, and a filing data of Mar. 21, 2006 and entitled A PLANER ANTENNA STRUCTURE, having a Ser. No. 11/451,752, and a filing date of Jun. 12, 2006.

The impedance matching circuits 134 and 136 facilitate matching the impedance of the corresponding antenna 130 and 132 with the power amplifier module 84 and/or the low noise amplifier module 72. Each of the impedance matching circuits 134 and 136 may include a transformer balun, a capacitor, and/or an inductor coupled in series and/or in parallel with the antenna 130 and 132 to achieve the desired impedance matching at the desired operating frequency.

Figure 6:
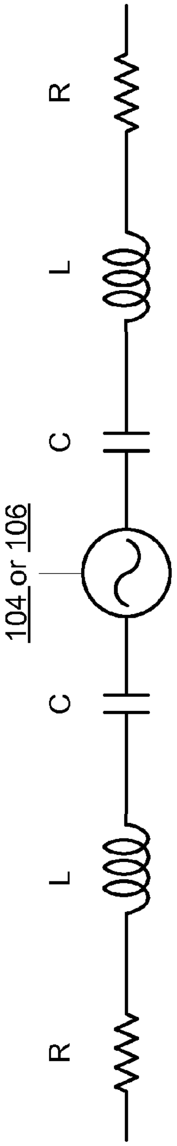
FIG. 6 is a schematic block diagram of an equivalent circuit of an embodiment of an antenna of a multiple frequency antenna array in accordance with the present invention.

FIG. 6 is a schematic block diagram of an equivalent circuit of an embodiment of an antenna 130 or 132 of the multiple frequency antenna array 75 coupled to a signal source (e.g., the first or second representation 104 or 106 of the RF signal 88 or 98). In this example, the antenna is a dipole antenna (e.g., has a total length corresponding to ½ wavelength of the frequency of the signals it transceives) and includes a resistive component (R), and inductive component (L), and a capacitive component (C). As previously mentioned, the response of the antenna is based on its quality factor (Q), which is based on its inductive, resistive, and capacitive properties. As such, by controlling the R, L, and/or C of the antenna, the desired response may be obtained. In one embodiment, the inherent R, L, and/or C of the antenna 130 or 132 may be controlled to achieve the desired response. In another embodiment, an external R, L, and/or C is coupled in series and/or in parallel to the antenna 130 or 132 to provide the desired response. In yet another embodiment, the external R, L, and/or C may be adjustable to fine tune the antenna response 118 or 120.

Thus, by transmitting an RF signal via multiple antennas, each with a different response and transmitting a different representation of the RF signal (e.g., RF signal is transmitted with a carrier frequency corresponding to the carrier frequency of the RF signal plus or minus a frequency offset) nulls produced by transmitting the signal via multiple antennas using the same carrier frequency is reduced. Further, by selecting relatively small frequency offsets, the channel bandwidth of the transceiver does not need to be changed.

Figure 7:
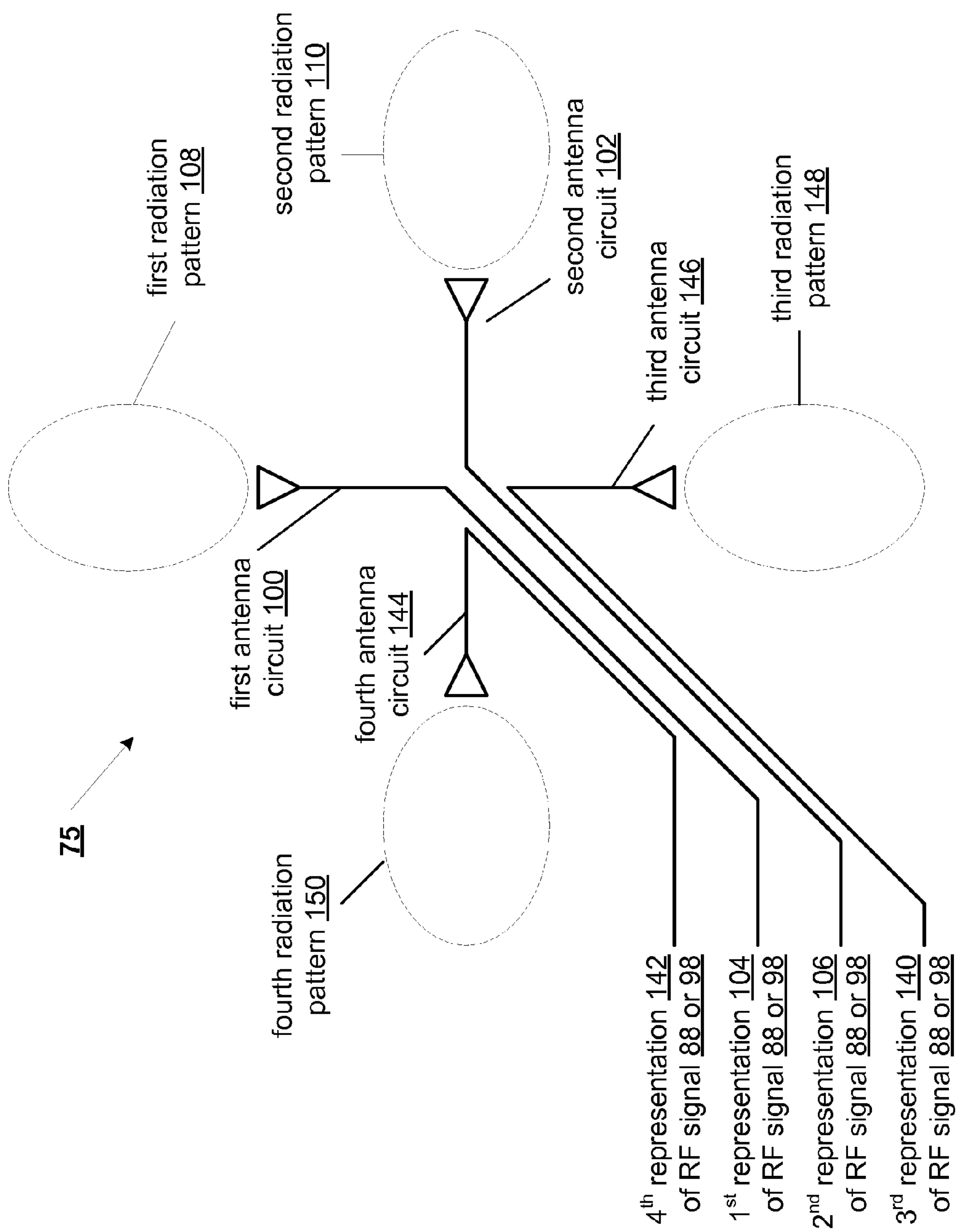
FIG. 7 is a diagram of another embodiment of a multiple frequency antenna array in accordance with the present invention.

FIG. 7 is a diagram of another embodiment of a multiple frequency antenna array 75 that includes the first antenna circuit 100, the second antenna circuit 102, a third antenna circuit 146, and a fourth antenna circuit 144. Each of the antenna circuits 100, 102, 144, and 146 have a corresponding radiation pattern 108, 110, 148, and 150, which may be produced by beamforming and/or different polarizations of the antennas. The distance between the antenna circuits 100, 102, 144, and 146 may be approximately ½ wavelength or some other portion of the wavelength of the RF signals being transceived. Note that the third and fourth antenna circuits 146 and 144 may have a similar construction as the first and second antenna circuits 100 and 102, but with different radiation patterns 148 and 150.

Figure 9:
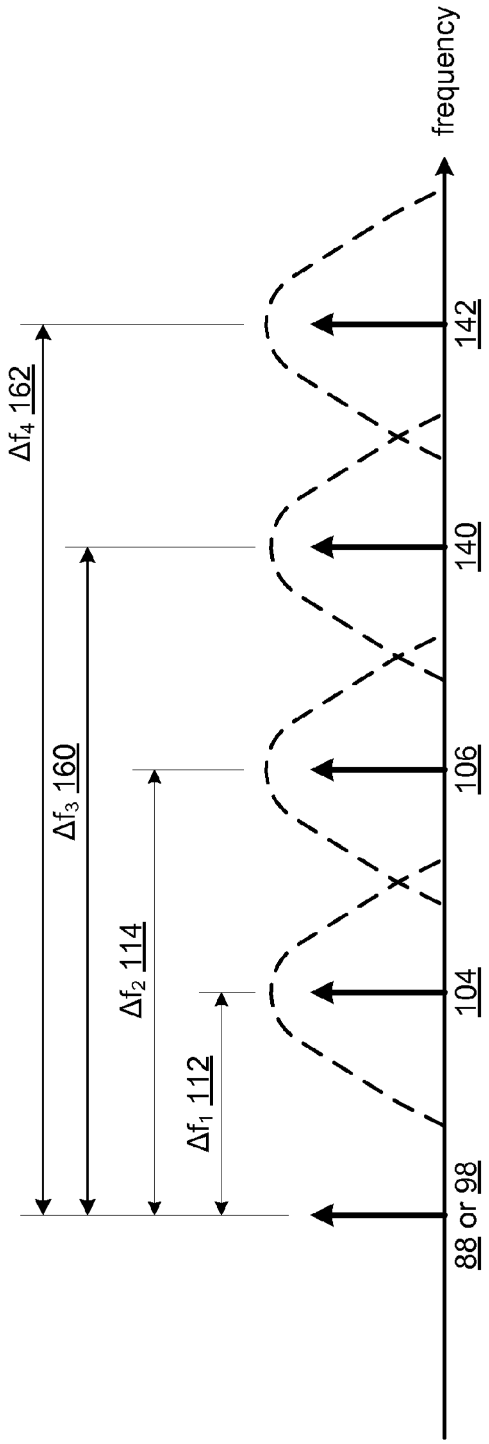
FIG. 9 is a frequency domain diagram of responses of another embodiment of the multiple frequency antenna array embodiment of FIG. 7.

In an embodiment, the third antenna circuit 146 transmits a third representation 140 of the RF signal (e.g., the inbound RF signal 88 or the outbound RF signal 98) at a third carrier frequency, which corresponds to the carrier frequency of the RF signal and a third frequency offset. The fourth antenna circuit 144 transmits a fourth representation 142 of the RF signal at a fourth carrier frequency, which corresponds to the carrier frequency of the RF signal and a fourth frequency offset. A frequency domain diagram of this embodiment is illustrated in FIG. 9, where each of the four representations 104, 106, 140, and 142 are offset in frequency from the carrier frequency of the RF signal 88 or 98 by a different frequency offset 112, 114, 160, and 162.

Figure 8:
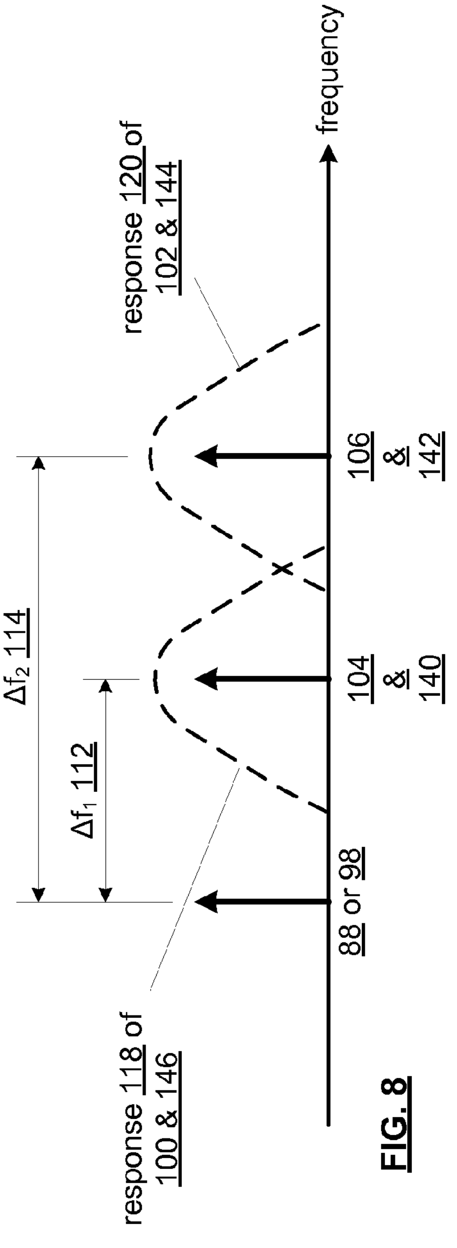
FIG. 8 is a frequency domain diagram of responses of one embodiment of the multiple frequency antenna array embodiment of FIG. 7.

Returning to the discussion of FIG. 7 and to another embodiment, the third antenna circuit 146 is tuned to the first carrier frequency. As such, the third antenna circuit 146 transmits a third representation 140 of the RF signal at the first carrier frequency. The fourth antenna circuit 144 is tuned to the second carrier frequency. As such, the fourth antenna circuit 144 transmits a fourth representation 142 of the RF signal at the second carrier frequency. In this example, since the radiation pattern of the third antenna circuit is approximately in the opposite direction as the radiation pattern of the first antenna circuit, there will be minimal in-air combining of the signals, thus creating nulls should be minimal. The same applies for the second and fourth antenna structures. A frequency domain diagram of this antenna array 75 is shown in FIG. 8.

Figure 10:
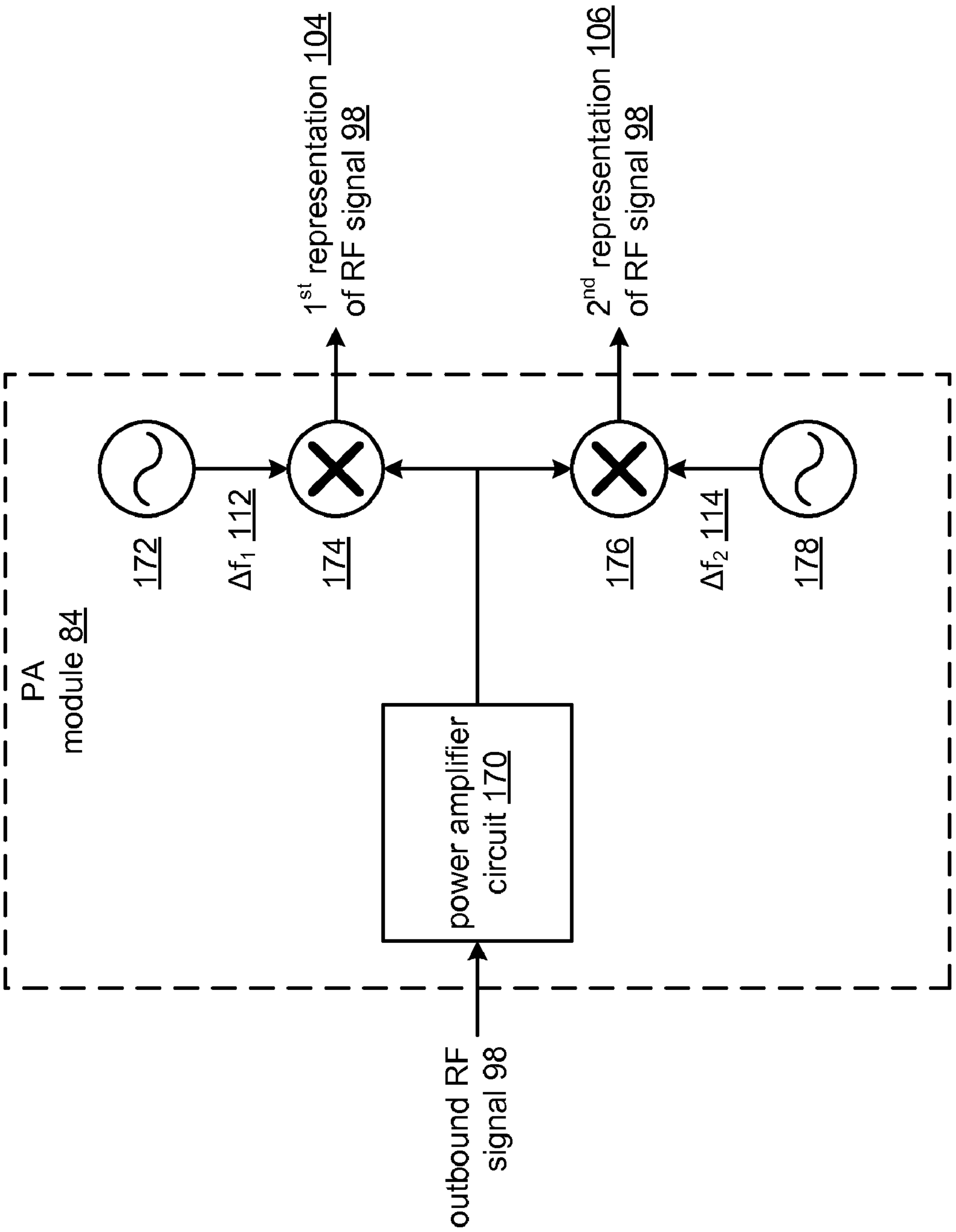
FIG. 10 is a schematic block diagram of an embodiment of a power amplifier module in accordance with the present invention.

FIG. 10 is a schematic block diagram of an embodiment of a power amplifier module 84 that includes a power amplifier circuit 170, which may be a power amplifier or a pre-amplifier, mixers 174 and 176, and frequency offset signal sources 172 and 178. The power amplifier circuit 170 amplifies the outbound RF signal 98 to produce an amplified RF signal. The first signal source 172 generates the first frequency offset (Δf1) 112 and the second signal source generates the second frequency offset (Δf2) 114. Note that the first and second frequency offsets 112 and 114 may be sinusoidal signals having the desired frequencies.

The first mixer 174 mixes the amplified RF signal with the first frequency offset 112 to produce the first representation 104 of the RF signal 98. The second mixer 176 mixes the amplified RF signal with the second frequency offset 114 to produce the second representation 106 of the RF signal 98. Note that with the antenna circuits 100 and 102 having a desired quality factor and half power factor, the other side band produced by the multiplying of two sinusoidal signals is out of band of the antenna such that it may be ignored. Alternatively, the antenna circuit and/or the power amplifier module may include filtering to further attenuate the other side band. Further note that the antenna circuits 100 and 102 may be tuned to either side band produced by the mixers 174 and 176 and that one antenna circuit may be tuned to the upper side band, while the other antenna circuit may be tuned to the lower side band. Still further note that the first and second frequency offsets may have the same frequency, where one representation of the RF signal corresponds to the lower side band and the other representation of the RF signal corresponds to the upper side band. In this latter alternative, the power amplifier module 84 may only include one mixer and one signal source to generate the first and second representations 104 and 106 of the RF signal 98.

Figure 11:
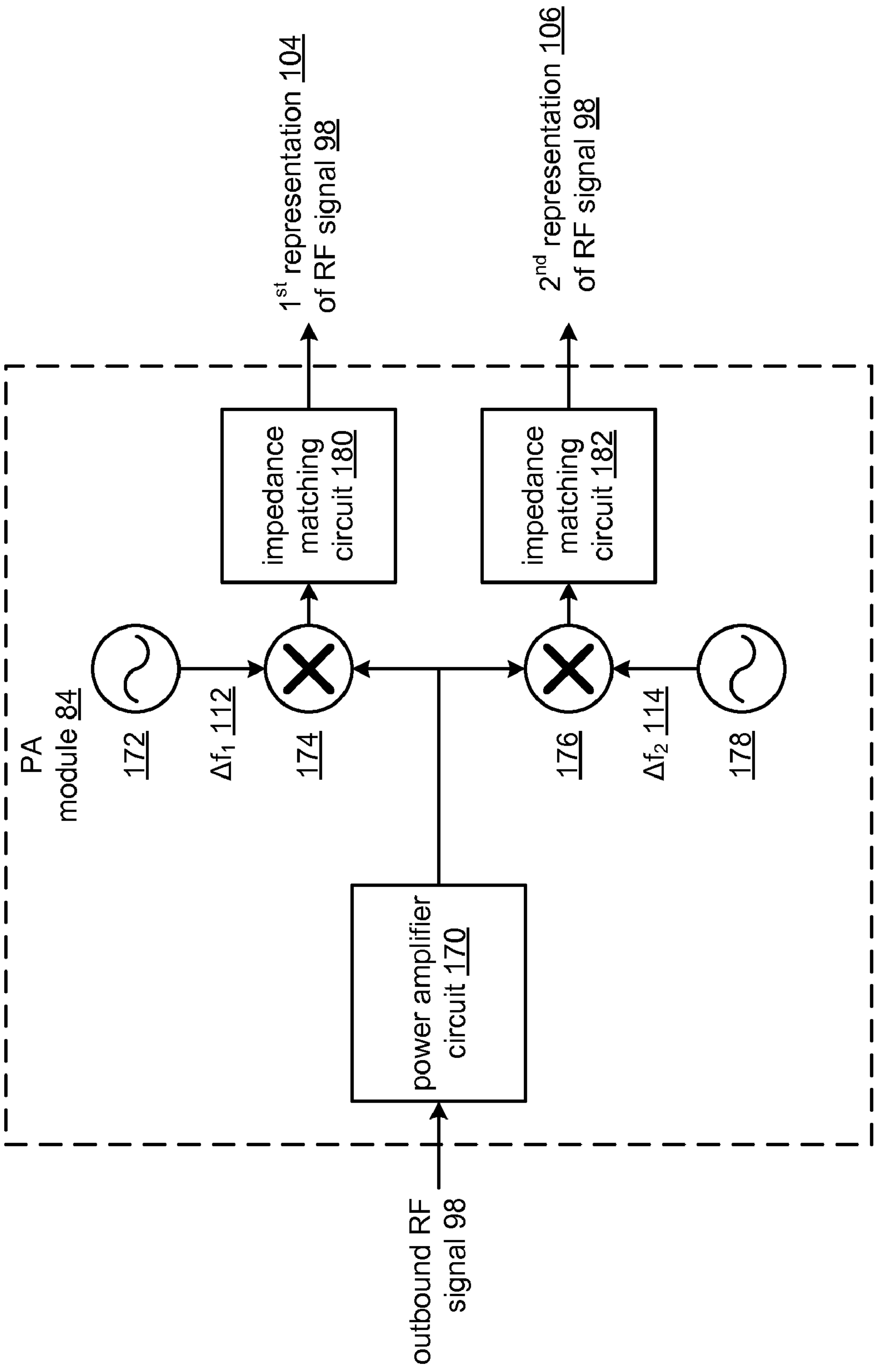
FIG. 11 is a schematic block diagram of another embodiment of a power amplifier module in accordance with the present invention.

FIG. 11 is a schematic block diagram of another embodiment of a power amplifier module 84 that includes the power amplifier circuit 170, mixers 174 and 176, frequency offset signal sources 172 and 178, and impedance matching circuits 180 and 182. The power amplifier circuit 170 amplifies the outbound RF signal 98 to produce an amplified RF signal. The first signal source 172 generates the first frequency offset (Δf1) 112 and the second signal source generates the second frequency offset (Δf2) 114. Note that the first and second frequency offsets 112 and 114 may be sinusoidal signals having the desired frequencies and/or the same frequencies.

The first mixer 174 mixes the amplified RF signal with the first frequency offset 112 to produce the first representation 104 of the RF signal 98. The second mixer 176 mixes the amplified RF signal with the second frequency offset 114 to produce the second representation 106 of the RF signal 98. The first impedance matching circuit 180, which may include a transformer balun, a capacitor, and/or an inductor, provides the first representation 104 of the RF signal 98 to the antenna array 75. The second impedance matching circuit 182, which may include a transformer balun, a capacitor, and/or an inductor, provides the first representation 106 of the RF signal 98 to the antenna array 75.

Figure 12:
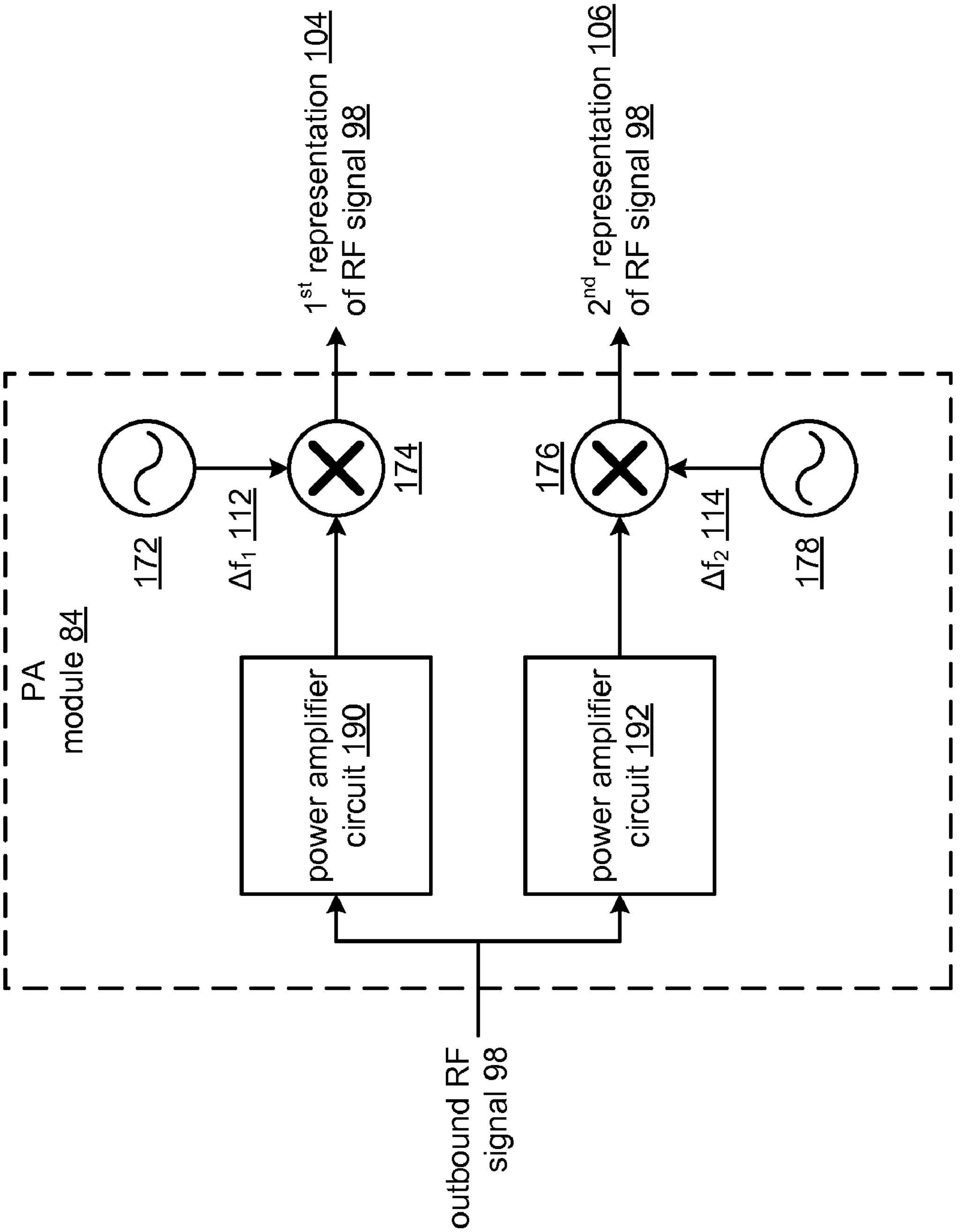
FIG. 12 is a schematic block diagram of another embodiment of a power amplifier module in accordance with the present invention.

FIG. 12 is a schematic block diagram of another embodiment of a power amplifier module 84 that includes first and second power amplifier circuits 190 and 192, which each may be a power amplifier or a pre-amplifier, mixers 174 and 176, and frequency offset signal sources 172 and 178. The power amplifier circuits 190 and 192 amplify the outbound RF signal 98 to produce two amplified RF signals. The first signal source 172 generates the first frequency offset (Δf1) 112 and the second signal source generates the second frequency offset (Δf2) 114. Note that the first and second frequency offsets 112 and 114 may be sinusoidal signals having the desired frequencies.

The first mixer 174 mixes a first of the two amplified RF signals with the first frequency offset 112 to produce the first representation 104 of the RF signal 98. The second mixer 176 mixes a second of the two amplified RF signals with the second frequency offset 114 to produce the second representation 106 of the RF signal 98.

Figure 13:
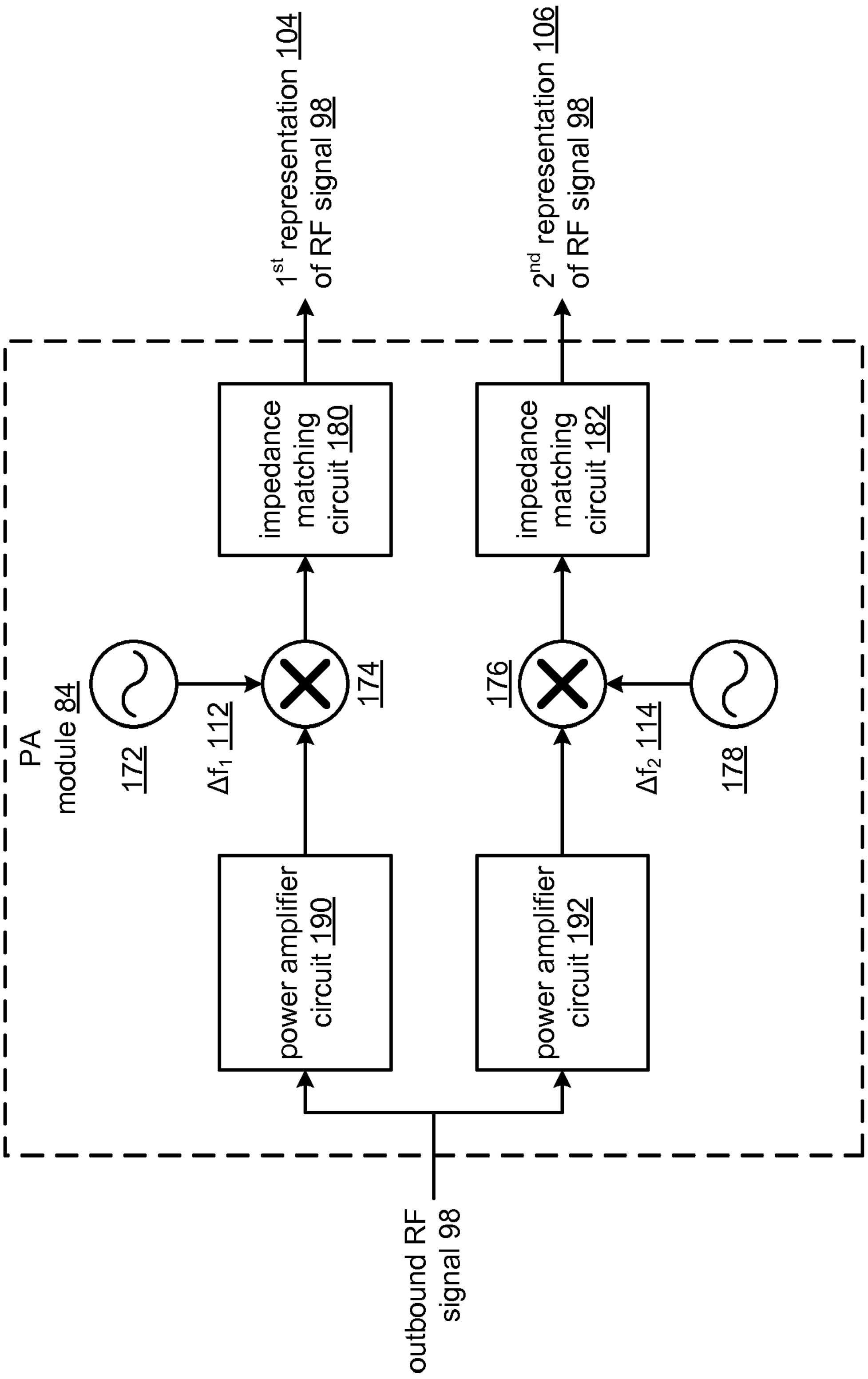
FIG. 13 is a schematic block diagram of another embodiment of a power amplifier module in accordance with the present invention.

FIG. 13 is a schematic block diagram of another embodiment of a power amplifier module that includes first and second power amplifier circuits 190 and 192, which each may be a power amplifier or a pre-amplifier, mixers 174 and 176, frequency offset signal sources 172 and 178, and impedance matching circuits 180 and 182. The power amplifier circuits 190 and 192 amplify the outbound RF signal 98 to produce two amplified RF signals. The first signal source 172 generates the first frequency offset (Δf1) 112 and the second signal source generates the second frequency offset (Δf2) 114. Note that the first and second frequency offsets 112 and 114 may be sinusoidal signals having the desired frequencies.

The first mixer 174 mixes a first of the two amplified RF signals with the first frequency offset 112 to produce the first representation 104 of the RF signal 98. The second mixer 176 mixes a second of the two amplified RF signals with the second frequency offset 114 to produce the second representation 106 of the RF signal 98. The first impedance matching circuit 180, which may include a transformer balun, a capacitor, and/or an inductor, provides the first representation 104 of the RF signal 98 to the antenna array 75. The second impedance matching circuit 182, which may include a transformer balun, a capacitor, and/or an inductor, provides the first representation 106 of the RF signal 98 to the antenna array 75.

Figure 14:
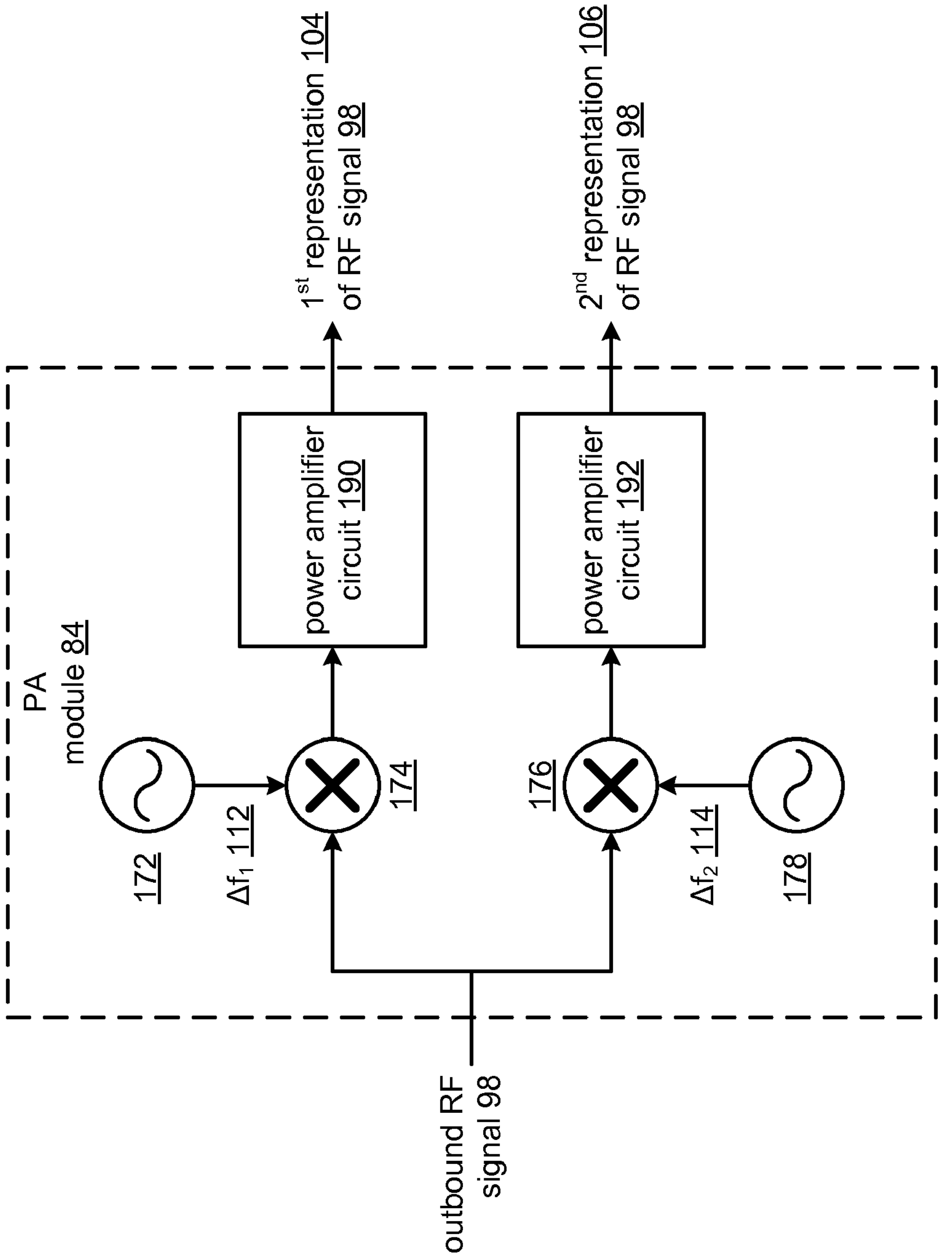
FIG. 14 is a schematic block diagram of another embodiment of a power amplifier module in accordance with the present invention.

FIG. 14 is a schematic block diagram of another embodiment of a power amplifier module 84 that includes first and second power amplifier circuits 190 and 192, which each may be a power amplifier or a pre-amplifier, mixers 174 and 176, and frequency offset signal sources 172 and 178. The first mixer 174 mixes outbound RF signals 98 with the first frequency offset 112 to produce a first mixed representation of the RF signal 98. The second mixer 176 mixes the outbound RF signals 98 with the second frequency offset 114 to produce a second mixed representation of the RF signal 98. The power amplifier circuit 190 amplifies the first mixed representation of the RF signal 98 to produce the first representation 104 of the RF signal 98. The power amplifier 192 amplifies the second mixed representation of the RF signal 98 to produce the second representation 106 of the outbound RF signal 98.

Figure 15:
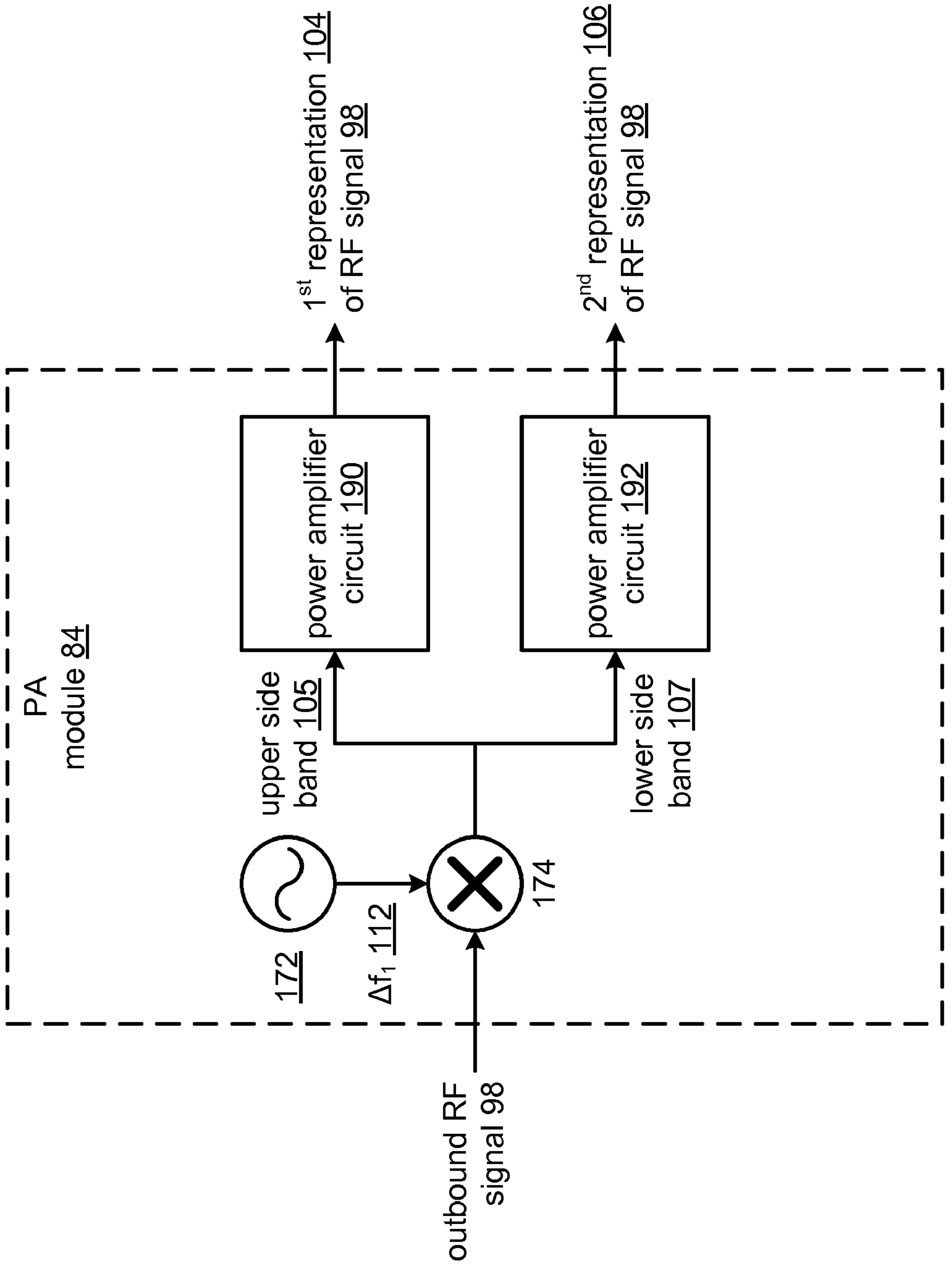
FIG. 15 is a schematic block diagram of another embodiment of a power amplifier module in accordance with the present invention.

FIG. 15 is a schematic block diagram of another embodiment of a power amplifier module 84 that includes first and second power amplifier circuits 190 and 192, which each may be a power amplifier or a pre-amplifier, a mixers 174, and a frequency offset signal source 172. The mixer 174 mixes outbound RF signals 98 with the first frequency offset 112 to produce a first mixed representation of the RF signal 98 and a second mixed representation of the RF signal 98. In this embodiment, the first mixed representation corresponds to an upper side band 105 and the second mixed signal corresponds to a lower side band 107. The power amplifier circuit 190 amplifies the first mixed representation of the RF signal 98 to produce the first representation 104 of the RF signal 98. The power amplifier 192 amplifies the second mixed representation of the RF signal 98 to produce the second representation 106 of the outbound RF signal 98.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A multiple frequency antenna array comprises:

a first antenna circuit tuned to a first carrier frequency to produce a first radiation pattern, wherein the first antenna circuit transmits a first representation of a radio frequency (RF) signal at the first carrier frequency, and wherein the first carrier frequency corresponds to a carrier frequency of the RF signal with a first frequency offset;

a second antenna circuit tuned to a second carrier frequency to produce a second radiation pattern, wherein the second antenna circuit transmits a second representation of the RF signal at the second carrier frequency, and wherein the second carrier frequency corresponds to the carrier frequency of the RF signal with a second frequency offset;

a third antenna circuit tuned to a third carrier frequency to produce a third radiation pattern, wherein the third antenna circuit transmits a third representation of the RF signal at the third carrier frequency, and wherein the third carrier frequency corresponds to the carrier frequency of the RF signal with a third frequency offset; and a fourth antenna circuit tuned to a fourth carrier frequency to produce a fourth radiation pattern, wherein the fourth antenna circuit transmits a fourth representation of the RF signal at the fourth carrier frequency, and wherein the fourth carrier frequency corresponds to the carrier frequency of the RF signal with a fourth frequency offset, in which the first, second third and fourth radiation patterns are different from each other and in which at least the first frequency offset and the second frequency offset have different frequency offset values and still maintain the first carrier frequency and the second carrier frequency within a bandwidth of the RF signal, but have sufficient frequency separation to inhibit nulling of the first and second radiation patterns.

2. The multiple frequency antenna array of claim 1, wherein each of the antenna circuits comprises:

an antenna having a resistive component, an inductive component, and a capacitive component, wherein the resistive component, the inductive component, and the capacitive component have a value to provide a resonant frequency corresponding to a respective one of the carrier frequencies and to provide a quality factor for a predetermined level of frequency spectrum overlap among the carrier frequencies.

3. The multiple frequency antenna array of claim 2, wherein each of the antenna circuits comprises at least one of:

a resistor coupled to a respective antenna to provide, in combination with the resistive component of the antenna, a resistance of a respective one of the antenna circuits;

a capacitor coupled to a respective antenna to provide, in combination with the capacitive component of the antenna, a capacitance of a respective one of the antenna circuits; and an inductor coupled to a respective antenna to provide, in combination with the inductive component of the antenna, an inductance of the a respective one of the antenna circuits, wherein at least one of the resistor, the capacitor, and the inductor, in combination with, the resistive component, the inductive component, and the capacitive component provide the resonant frequency corresponding to a respective one of the carrier frequencies and provide the quality factor for the predetermined level of frequency spectrum overlap among the carrier frequencies.

4. The multiple frequency antenna array of claim 2, wherein each of the antenna circuits comprises at least one of:

an adjustable resistor coupled to a respective antenna to provide, in combination with the resistive component of the antenna, a resistance of a respective one of the antenna circuits;

an adjustable capacitor coupled to a respective antenna to provide, in combination with the capacitive component of the antenna, a capacitance of a respective one of the antenna circuits; and an adjustable inductor coupled to a respective antenna to provide, in combination with the inductive component of the antenna, an inductance of the a respective one of the antenna circuits, wherein at least one of the adjustable resistor, the adjustable capacitor, and the adjustable inductor, in combination with, the resistive component, the inductive component, and the capacitive component provide the resonant frequency corresponding to the a respective one of the carrier frequencies and provide the quality factor for the predetermined level of frequency spectrum overlap among the carrier frequencies.

5. The multiple frequency antenna array of claim 2, wherein each of the antenna circuits comprises:

an impedance matching circuit coupled to a respective antenna, wherein the impedance matching circuit is tuned to provide a desired impedance at a respective one of the carrier frequencies.

6. The multiple frequency antenna array of claim 2 comprises:

the antenna of the first antenna circuit being a distance of approximately one-half wavelength of the carrier frequency of the RF signal from the antenna of the second antenna circuit.

7. The multiple frequency antenna array of claim 2, wherein each of the antennas of the antenna circuits comprises least one of:

a monopole antenna;

a dipole antenna;

a Yagi antenna; and a helical antenna.

8. A multiple frequency antenna array comprises:

a first antenna circuit tuned to a first carrier frequency to produce a first radiation pattern, wherein the first antenna circuit transmits a first representation of a radio frequency (RF) signal at the first carrier frequency, and wherein the first carrier frequency corresponds to a carrier frequency of the RF signal with a first frequency offset;

a second antenna circuit tuned to a second carrier frequency to produce a second radiation pattern, wherein the second antenna circuit transmits a second representation of the RF signal at the second carrier frequency, and wherein the second carrier frequency corresponds to the carrier frequency of the RF signal with a second frequency offset;

a third antenna circuit tuned to the first carrier frequency to produce a third radiation pattern, wherein the third antenna circuit transmits a third representation of the RF signal at the first carrier frequency; and a fourth antenna circuit tuned to the second carrier frequency to produce a fourth radiation pattern, wherein the fourth antenna circuit transmits a fourth representation of the RF signal at the second carrier frequency, in which the first, second third and fourth radiation patterns are different from each other and in which the first frequency offset and the second frequency offset have different frequency offset values and still maintain the first carrier frequency and the second carrier frequency within a bandwidth of the RF signal, but have sufficient frequency separation to inhibit nulling of the first, second, third and fourth radiation patterns.

9. The multiple frequency antenna array of claim 8, wherein each of the antenna circuits comprises:

an antenna having a resistive component, an inductive component, and a capacitive component, wherein the resistive component, the inductive component, and the capacitive component have a value to provide a resonant frequency corresponding to a respective one of the carrier frequencies and to provide a quality factor for a predetermined level of frequency spectrum overlap among the carrier frequencies.

10. The multiple frequency antenna array of claim 9, wherein each of the antenna circuits comprises at least one of:

a resistor coupled to a respective antenna to provide, in combination with the resistive component of the antenna, a resistance of a respective one of the antenna circuits;

a capacitor coupled to a respective antenna to provide, in combination with the capacitive component of the antenna, a capacitance of a respective one of the antenna circuits; and an inductor coupled to a respective antenna to provide, in combination with the inductive component of the antenna, an inductance of the a respective one of the antenna circuits, wherein at least one of the resistor, the capacitor, and the inductor, in combination with, the resistive component, the inductive component, and the capacitive component provide the resonant frequency corresponding to a respective one of the carrier frequencies and provide the quality factor for the predetermined level of frequency spectrum overlap among the carrier frequencies.

11. The multiple frequency antenna array of claim 9, wherein each of the antenna circuits comprises at least one of:

an adjustable resistor coupled to a respective antenna to provide, in combination with the resistive component of the antenna, a resistance of a respective one of the antenna circuits;

an adjustable capacitor coupled to a respective antenna to provide, in combination with the capacitive component of the antenna, a capacitance of a respective one of the antenna circuits; and an adjustable inductor coupled to a respective antenna to provide, in combination with the inductive component of the antenna, an inductance of the a respective one of the antenna circuits, wherein at least one of the adjustable resistor, the adjustable capacitor, and the adjustable inductor, in combination with, the resistive component, the inductive component, and the capacitive component provide the resonant frequency corresponding to the a respective one of the carrier frequencies and provide the quality factor for the predetermined level of frequency spectrum overlap among the carrier frequencies.

12. The multiple frequency antenna array of claim 9, wherein each of the antenna circuits comprises:

an impedance matching circuit coupled to a respective antenna, wherein the impedance matching circuit is tuned to provide a desired impedance at a respective one of the carrier frequencies.

13. The multiple frequency antenna array of claim 9 comprises:

the antenna of the first antenna circuit being a distance of approximately one-half wavelength of the carrier frequency of the RF signal from the antenna of the second antenna circuit.

14. The multiple frequency antenna array of claim 9, wherein each of the antennas of the antenna circuits comprises least one of:

a monopole antenna;

a dipole antenna;

a Yagi antenna; and a helical antenna.

* * * * *

UNITED STATES PATENT AND TRADEMARK OFFICE

CERTIFICATE OF CORRECTION

| | |
|---|---|
| PATENT NO. | : 8,010,062 B2 |
| APPLICATION NO. | : 12/613759 |
| DATED | : August 30, 2011 |
| INVENTOR(S) | : Ahmadreza Rofougaran |

It is certified that error appears in the above-identified patent and that said Letters Patent is hereby corrected as shown below:

Title Page, Item (54), The title should appear as follows: "MULTIPLE FREQUENCY ANTENNA ARRAY FOR USE WITH AN RF TRANSMITTER OR TRANSCEIVER"
Col. 12, line 7, in Claim 1: after "second" insert --,--
Col. 12, line 38, in Claim 3: after "inductance of" delete "the"
Col. 12, line 59, in Claim 4: after "inductance of" delete "the"
Col. 12, line 64, in Claim 4: after "corresponding to" delete "the"
Col. 13, line 15, in Claim 7: before "least" insert --at--
Col. 13, line 41, in Claim 8: after "second" insert --,--
Col. 14, line 9, in Claim 10: after "inductance of" delete "the"
Col. 14, line 31, in Claim 11: after "inductance of" delete "the"
Col. 14, line 36, in Claim 11: after "corresponding to" delete "the"
Col. 14, line 54, in Claim 11: before "least" insert --at--

Signed and Sealed this
Tenth Day of July, 2012

David J. Kappos

David J. Kappos
*Director of the United States Patent and Trademark Office*